United States Patent [19]

Payne

[11] Patent Number: 4,684,971

[45] Date of Patent: Aug. 4, 1987

[54] ION IMPLANTED CMOS DEVICES

[75] Inventor: Richard S. Payne, Andover, Mass.

[73] Assignee: American Telephone and Telegraph Company, AT&T Bell Laboratories, Murray Hill, N.J.

[21] Appl. No.: 243,621

[22] Filed: Mar. 13, 1981

[51] Int. Cl.[4] .................. H01L 29/78; H01L 27/02
[52] U.S. Cl. .................. 357/42; 357/23.1; 357/88; 357/91
[58] Field of Search .................. 357/42, 41, 91, 40, 357/88, 89, 23.1

[56] References Cited

U.S. PATENT DOCUMENTS

| 3,821,781 | 6/1974 | Chang et al. | 357/44 |
| 4,067,100 | 1/1978 | Kojima et al. | 29/578 |
| 4,212,100 | 7/1980 | Paivinen et al. | 29/571 |
| 4,217,149 | 8/1980 | Sawazaki | 148/1.5 |
| 4,231,055 | 10/1980 | Iizuka | 357/42 |

FOREIGN PATENT DOCUMENTS 55-52266  4/1980  Japan .................. 357/42

Primary Examiner—J. Carroll
Attorney, Agent, or Firm—Lester H. Birnbaum

[57] ABSTRACT

A CMOS structure and method of manufacture are disclosed for achieving a high packing density in integrated circuits. Each device includes at least one high concentration surface region, (18 and 20) and at least one lower concentration background region (15 and 17) which permit the devices to be made close together. The devices can be fabricated with a single mask by using a lift-off technique in accordance with the method of the invention.

4 Claims, 13 Drawing Figures

ION IMPLANTED CMOS DEVICES

BACKGROUND OF THE INVENTION

This invention relates to complementary field effect transistors formed by ion implantation, and in particular to a structure and method of fabrication which permit high packing density.

Complementary field effect transistors (hereinafter designated CMOS), which comprise n-channel and p-channel devices formed in the same substrate, are recognized as advantageous in many applications requiring low power dissipation and fast switching speeds. Usually, the devices are formed by diffusion or implantation of a p-type "tub" in an n-type silicon substrate so that the n-channel device is fabricated in the tub and the p-channel device is fabricated in the adjacent portion of the substrate. This procedure necessarily led to the constraint that the concentration at the surface in the tub was much greater than the surface concentration of the substrate. Device constraints followed in terms of capacitance densities, threshold voltages and breakdown voltages.

It has thus been proposed to form the p-channel device in a second tub of n-conductivity type and higher impurity concentration than a more lightly doped substrate adjacent to the p-type tub so that control of the p-channel device could be optimized. These tubs are typically formed by successive surface implantations of boron and phosphorous impurities followed by a heating step whereby the impurity regions are driven into the bulk of the substrate (see, e.g., U.S. Pat. No. 3,821,781, issued to Chang). Using either the single tub or twin tub approach, a considerable amount of semiconductor area is needed due to the fact that the tub impurities will diffuse laterally as well as vertically during the drive-in to establish the desired tub depth. This is particularly troublesome in the twin-tub process since any significant overlap of the two tubs results in decreased doping concentration of each tub at the boundaries which can cause punch through or field inversion channeling during device operation. Typically, the separation of the implantation or diffusion mask windows for source and drain regions must be at least approximately 12 $\mu$m to avoid such effects when the tubs are diffused a vertical distance of 6 $\mu$m. While such dimensions are adequate for present circuits, it is desirable to save as much space as possible in future generations of IC circuits.

Therefore, it is a primary object of the invention to provide a CMOS structure and method of manufacture which requires little semiconductor space and therefore permits a high packing density.

It is a further object of the invention to define such a structure using a minimum number of masking steps.

SUMMARY OF THE INVENTION

These and other objects are achieved in accordance with the invention. In its structural aspects the invention is a CMOS device comprising a substrate of a first conductivity type having a major surface and at least one tub region of opposite conductivity type formed at said surface, wherein source and drain regions are formed. Included in the tub region is a surface region covering essentially the same area as said tub region and having the same conductivity type but a greater impurity concentration than said tub region. The surface region extends to a depth at least as great as the source and drain regions.

In accordance with its method aspects, the invention comprises the steps of forming a first multi-layer mask on the surface of the semiconductor, forming an opening in at least the top layer of the mask by means of a photoresist layer formed thereon, and then subjecting the structure to a first ion beam of impurities so as to form a first tub region of one conductivity type in the area of semiconductor defined by said opening. A second mask material is formed over the first mask and the opening therein, and the portion of the second mask which overlies the first mask is removed by removing the underlying photoresist. The structure is subject to a second ion beam of impurities to form a second tub region of opposite conductivity type adjacent to the first localized region in the area not covered by the second mask layer. The second mask layer is removed, and the structure is subject to a third ion beam of impurities to form a first surface region of the one conductivity type in the area not covered by the first mask layer. A thick oxide layer is then formed over the area of semiconductor not covered by the first mask layer, and one more layer of the first mask layer is removed. The structure is subjected to a fourth ion beam of impurities so as to form a second surface region of opposite conductivity type in the area not covered by the thick oxide portion.

BRIEF DESCRIPTION OF THE DRAWING

These and other features of the invention are delineated in detail in the following description. In the drawing.

It will be appreciated that for purposes of illustration, these figures are not necessarily drawn to scale.

DETAILED DESCRIPTION

The invention will be described with reference to the series of steps illustrated in FIGS. 1–10 and the impurity profiles of FIGS. 11, 12 and 13. It will be appreciated that the figures show fabrication of a device which is typically part of an integrated circuit including many other devices.

Figure 1:
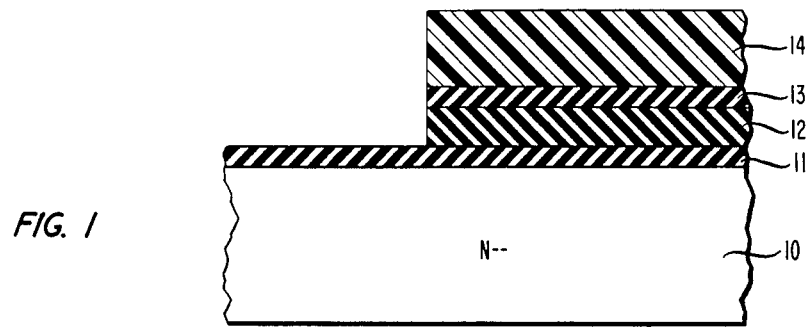
FIGS. 1–10 are cross-sectional views of a portion of an integrated circuit showing various stages of fabrication in accordance with one embodiment of the invention.

In this example, as shown in FIG. 1, the device is fabricated in a silicon semiconductor substrate, 10, of "N—" conductivity type which typically has a doping concentration of approximately $1-2\times10^{14}$ ions/cm$^3$. The substrate is typically approximately 20 mils thick. Formed on one major surface of the substrate, as for example by thermal oxidation, is a layer, 11, comprising SiO$_2$. This layer is typically approximately 350 Angstroms thick but in general can be within the range 100–2000 Angstroms. A layer, 12, typically comprising silicon nitride or alumina is deposited over the SiO$_2$ layer, as for example by chemical vapor deposition. In this example, the layer is approximately 1200 Angstroms thick and is silicon nitride but in general will be 500–3000 Angstroms thick. Another layer, 13, comprising SiO2 is then grown over the silicon nitride layer by thermal oxidation to a thickness of approximately 100 Angstroms. This layer is used to mask the nitride during phosphoric acid etching and is not necessary to the invention. A thickness within the range 50 to 150 Angstroms could be used. These layers constitute a multilayer masking material which is utilized to define the tubs as indicated below. It will be appreciated that other layers of material and thicknesses outside the ranges given may be utilized consistent with the invention.

As also shown in FIG. 1, a layer 14, of photoresist is deposited over the layer 13 to a thickness of approximately 1 micron and developed according to known photolithographic techniques to define the area of the semiconductor which will comprise one of the tubs. The portion of the SiO2 layer thus exposed is removed by applying a solution comprising diluted hydrofluoric acid (typically at a ratio of 10 parts H2O to 1 part HF), followed by etching of the underlying exposed portion of the nitride layer by an etchant comprising concentrated phosphoric acid. Alternatively, plasma etching of the silicon oxide and/or nitride layers can be used. It will be appreciated that other etchants can be employed as well. This leaves only the first layer, 11, of SiO2 overlying the area which will comprise a tub.

Figure 2:
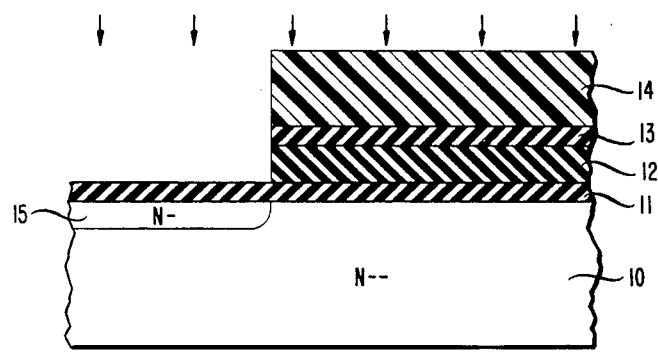

Next, as shown in FIG. 2, the structure was exposed to a first ion beam of impurities illustrated by arrows in the figure. In this example, the first ion beam comprises phosphorous ions at an energy of approximately 30 KEV. The thickness of the various layers on the semiconductor is chosen so that the ion beam penetrates the portion of the exposed SiO2 layer, 11, but is blocked by the multilayers in the remaining areas of the device. The implantation thereby forms at the semiconductor surface a first tub region, 15, having the same conductivity type as the substrate but higher impurity concentration (designated "N—" in the figure). This region typically has an initial depth of approximately 400–500 Angstroms. A typical energy range for the ion beam would be 10–200 KEV.

Figure 3:
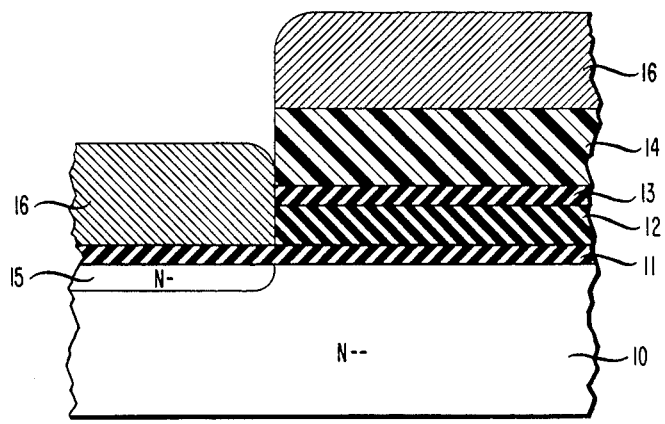

Next, as shown in FIG. 3, a layer, 16, comprising a second mask material is deposited over the structure. In this example, the material is aluminum, but it can be any material which will stop an implant that the SiO2—Si3N4 layers will not, can be deposited at a sufficiently low temperature so as not to damage the silicon substrate, and can be lifted off by the dissolution of the photoresist. Suitable other materials include copper, iron, gold, and indium. The thickness of the layer is approximately 10,000 Angstroms in this example, but will generally lie within the range 3000–15,000 Angstroms as long as it is thinner than the combined thickness of layers 12, 13 and 14. The layer can be deposited by evaporation or any other suitable technique.

Figure 4:
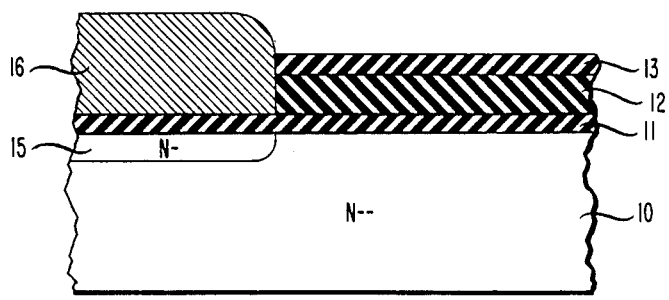

The portion of the mask material overlying the as yet unimplanted portion of the semiconductor is then removed by removing the underlying photoresist layer 14. Such "lift-off" of the mask material can be accomplished by several means known in the art. For example, the structure can be soaked in a photoresist stripper subject to heat and supersonic vibration which causes the resist to swell, and the resist can then be peeled off along with the overlying mask. Another method is to heat the structure in an appropriate gas to destroy the adhesion of the photoresist and then peel off both layers. (See, e.g., U.S. Pat. No. 4,067,100, issued to Kojima, which is incorporated by reference herein). The resulting structure is shown in FIG. 4.

Figure 5:
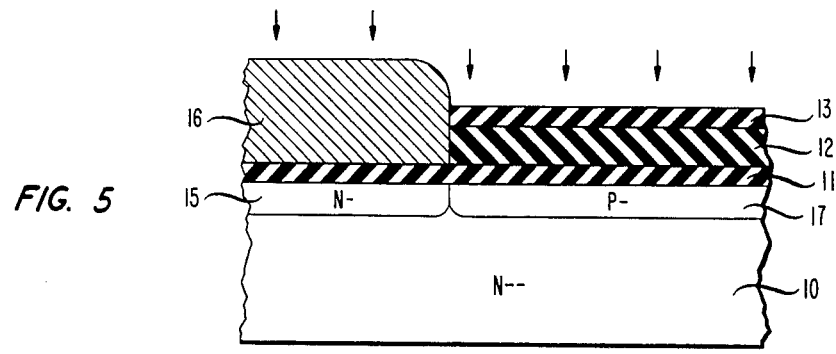

Next, as shown in FIG. 5, the structure is subjected to a second ion beam of impurities which is again illustrated by arrows. In this step, the ions are boron. The energy of the beam is chosen so that the impurities will penetrate the nitride and oxide layers (11, 12 and 13) but will not penetrate the second mask material (16). For example, an energy of approximately 75 KEV may be utilized, and energies in the range 40–100 KEV may be useful.

The implantation forms a second tub region, 17, of conductivity type designated "P-" at the surface of the semiconductor adjacent to the "N-"type region. The depth of the region is initially approximately 400–500 Angstroms. The mask material can then be stripped off by applying a standard aluminum etch such as dilute HCL.

Figure 6:
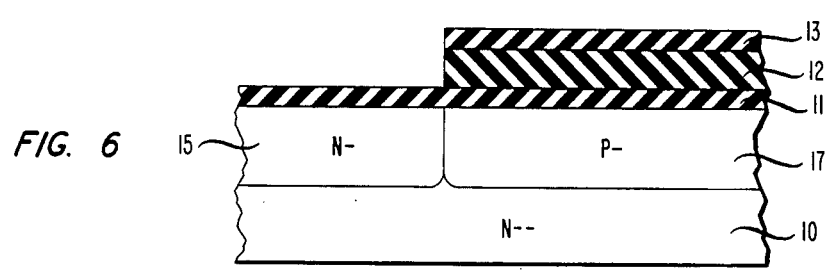

Subsequent to this implantation, both n- and p- regions can be driven into the bulk of the substrate to a desired depth as shown in FIG. 6. In this example, a typical depth for the impurities is approximately 4–5μ. The drive-in may be accomplished by heating the structure in N2 at a temperature of approximately 1200 degrees Celsius for 4 hours. These values will of course depend upon the desired depth and the particular impurities involved. The oxide layer, 11, over the n-type tub and the oxide layer, 13, over the nitride layer, 12, are then stripped off by applying an etchant of diluted hydrofluoric acid.

Figure 7:
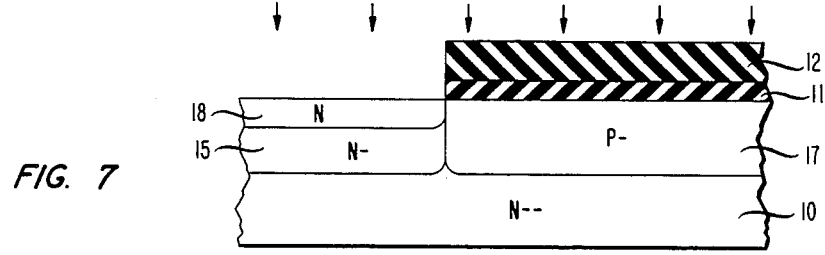

Next, as shown in FIG. 7, the structure is subject to a third ion beam of impurities which in this step again comprises phosphorous ions. Here, the energy is approximately 30 KEV. The energy is chosen so that the ions will be blocked by the SiO2 and Si3N4 layers to produce an "N" type surface region, 18, covering essentially the same area as the "N-" tub 15. The depth is approximately 400–500 Angstroms. A useful energy range is 30–100 KEV.

Figure 8:
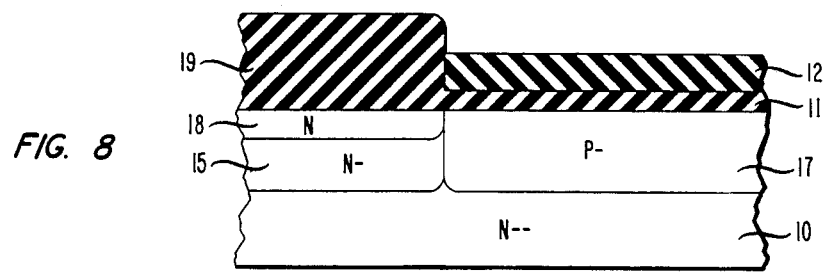

Next, as shown in FIG. 8, a thick oxide portion 19 is formed over the previously implanted regions 18 and 15 utilizing the nitride layer, 12, as a mask. The thickness of this portion should be sufficient to block the subsequent ion implantation to be described. In this example, the layer is approximately 4000 Angstroms thick, but in general would fall within the range 3000–4500 Angstroms. The portion is formed by heating in wet O2 at a temperature of approximately 1000 degrees Celsius for 1 hour. Any means of growing the requisite thickness of SiO2 masked by the Si3N4 is suitable. Typically, heating in wet O2 at 900–1050 degrees Celsius for 1–4 hours will be useful.

It should be appreciated that in the formation of the oxide a portion of the semiconductor surface will be consumed. The N region 18 will diffuse ahead of the growing oxide and so will remain at the new surface. For purposes of illustration, the semiconductor surface is shown as flat, although, as a result of oxidation, there will be an indentation in the area of the N tub.

The nitride layer, 12, can then be stripped off by applying an etchant which will not affect the oxide, such as a solution of concentrated phosphoric acid.

Figure 9:
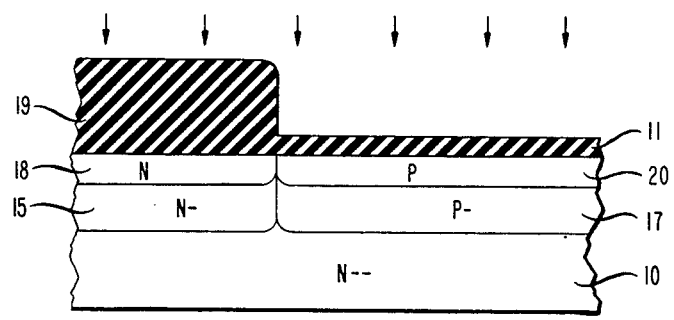

As shown in FIG. 9, the structure is then subjected to a fourth ion beam of impurities which in this case comprises boron ions. The energy of the beam is such that the thick portion of the oxide will prevent penetration of the ions to the semiconductor while the ions pass through the thin portion of the oxide. In this example, the energy is approximately 30 KEV. A range of 30–50 KEV will generally be used.

The beam thereby forms a surface region, 20, of P conductivity type at the surface of the semiconductor covering essentially the same area as the P- tub 17. The initial depth is approximately 1000–1200 Angstroms.

Each of the surface regions can then be driven to their desired depth by heating the structure. In this example, a depth of 1–2$\mu$ is attained by heating in $N_2$ at a temperature of 1100 degrees Celsius for 1 hour. Heating at temperatures in the range 1000–1100 degrees Celsius for 1–4 hours is useful. Such heating is usually performed during subsequent device processing and so a separate step is not ordinarily needed. The resulting impurity profile in both tubs thereby has the general shape illustrated in FIG. 11, where the abscissa is depth and the ordinate is impurity concentration.

Figure 10:
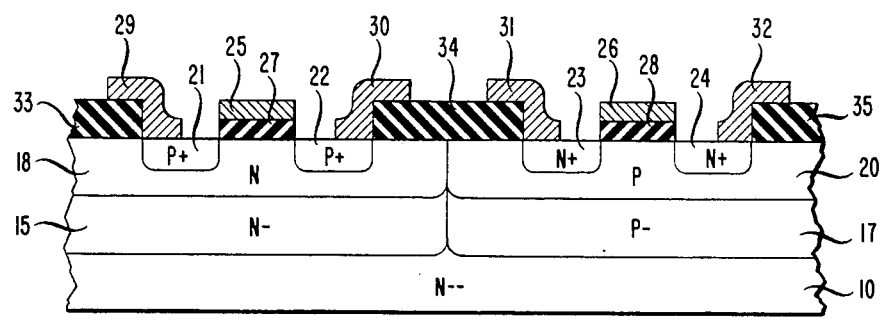

The oxide layer can then be stripped off, for example, with a solution of dilute HF, and fabrication may proceed in accordance with standard techniques to produce the CMOS device depicted in FIG. 10. The p-channel device includes source and drain regions, 21 and 22, respectively, of P+ conductivity type formed with the N surface region, 18. Similarly, the n-channel device includes source and drain regions, 23 and 24, of N+ conductivity type formed within the P surface region 20. These source and drain regions would typically have a surface impurity concentration of approximately $10^{19}$–$10^{20}$ ions/cm$^3$ and a depth of 1 $\mu$m. It will be noted, therefore, that the n and p surface regions, 18 and 20, will be present at the surface of their respective devices except for the areas comprising the source and drain. The depth of the surface regions should be at least as great as that of the source and drain regions.

The devices further include gate electrodes, 25 and 26, typically comprising polycrystalline silicon, formed over gate oxide portions 27 and 28. Ohmic contacts to source and drain regions are provided by metal portions, 29–32, typically comprising aluminum, formed over field oxide portions 33–35 and contact windows in said oxide. These features and their method of fabrication are well-known in the art and consequently are not discussed in detail.

It will be appreciated that during the drive-in of the source and drain regions, 21–24, the regions 18, and 20 will also be driven somewhat further into the substrate, while the depth of the tubs 15 and 17 is essentially unaffected. In a typical device, the final depth of surface regions 18 and 20 would be approximately 1–2$\mu$ and the depth of tub regions 15 and 17 would be typically 3–8$\mu$. The surface impurity concentration of the surface regions is typically 0.5–5 $\times 10^{16}$ ions/cm$^3$ and that of the tub regions is typically $10^{15}$–$10^{16}$ ions/cm$^3$, with the former concentration being at least twice as much as the latter over these ranges.

Figure 11:
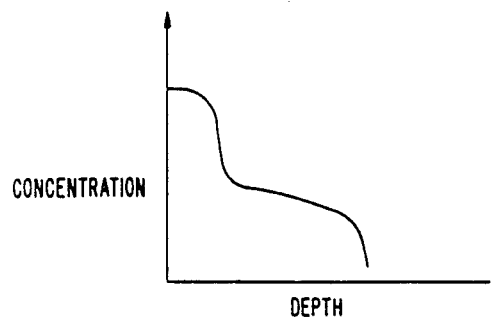
FIG. 11 is an illustration of the approximate concentration of implanted impurities as a function of depth in the semiconductor for a device in accordance with one embodiment of the invention.
Figure 12:
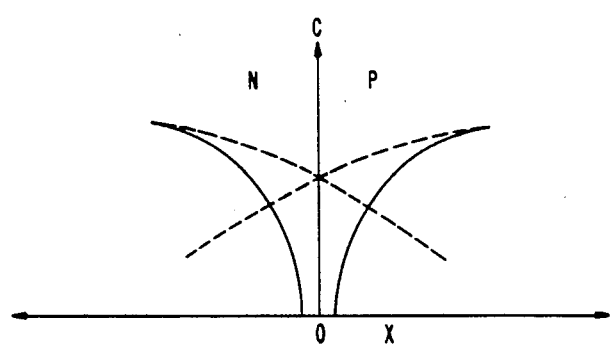
FIGS. 12 and 13 are illustrations of approximate concentration of impurities across a lateral dimension in the semiconductor in accordance with the prior art and the same embodiment of the invention, respectively.
Figure 13:
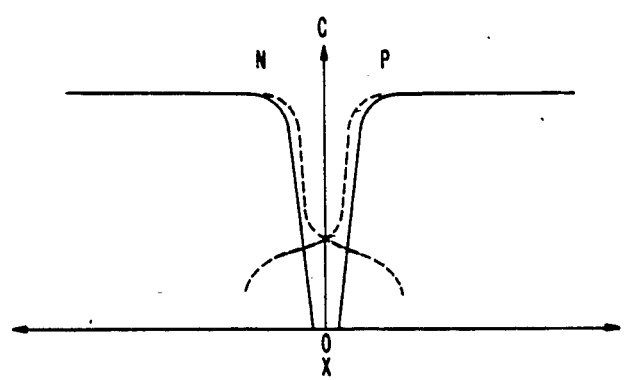

The major advantage in formation of the high-low implant profile of FIG. 11 is illustrated in FIGS. 12 and 13, which show the approximate distribution of impurities laterally along the semiconductor surface for, respectively, a typical prior art CMOS device and a CMOS device made in accordance with the invention. The dashed lines show the individual profiles for N and P regions and the solid lines represent the composite profile on each side of the boundary between devices (where x=0). It will be noted that in the prior art devices employing a single implant to form the device tubs, the overlap of the two tubs to any significant degree causes a substantial decrease in the composite concentration as illustrated in FIG. 12. This necessitated placing source and drain regions of adjacent devices (e.g., 22 and 23 of FIG. 10) at least 12$\mu$ apart in a typical device. In a device fabricated in accordance with the present invention, as illustrated in FIG. 13, the composite profiles remain high and then fall off rapidly at a much closer distance from the boundary. This is due to the high impurity concentration of surface regions 18 and 20 as well as the short diffusion lengths of these regions. On each side of the boundary, therefore, the high impurity concentration of the surface region (e.g., 18) is compensated for only by the low concentration tub region of the adjacent device (17) and substantial overlap is permitted. In a typical device, it is expected that separations of 5$\mu$ or less can be achieved between source and drain regions of adjacent devices.

It will be appreciated that although the invention is designed primarily for twin-tub structures, it may also be advantageous for single tub devices. In such cases, the separate n-tub (15) or p-tub (17) would be eliminated and the substrate itself would be used as a tub in those areas. The invention may permit closer spacing of device features in such structures due to the higher doping and short diffusion lengths of the surface region.

Various modification of the invention will become apparent to those skilled in the art. All such variations which basically rely on the teaching through which the invention has advanced the art are properly considered within the spirit and scope of the invention.

What is claimed is:

1. A CMOS device comprising a substrate (10) of a first conductivity type having a major surface, a first tub region (17) of opposite conductivity type formed at said surface wherein source and drain regions (23 and 24) are formed, a second tub region (15) of the same conductivity type but higher impurity concentration than said substrate wherein source and drain regions (21 and 22) are formed, CHARACTERIZED IN THAT there is included in each of said tub regions a surface region (20 and 18 respectively) covering essentially the same area as said tub region and having the same conductivity type but a greater impurity concentration than said tub region, and extending to a depth at least as great as that of said source and drain regions such that the impurities of the tub regions overlap but are compensated for by the impurities of the surface region of opposite conductivity type in the area of overlap.

2. The device according to claim 1 wherein the surface impurity concentration of the surface regions lies within the range 0.5–5 $\times 10^{16}$ ions/cm$^3$ and the surface impurity concentration of the tub regions lies within the range $10^{15}$–$10^{16}$ ions/cm$^3$.

3. The device according to claim 1 wherein the source and drain region of adjacent transistors (22 and 23) are placed no more than 5$\mu$ apart.

4. The device according to claim 1 wherein the tub and surface regions of the first conductivity type comprise phosphorous impurities and the tub and surface regions of opposite conductivity type comprise boron impurities.

* * * * *